United States Patent [19]

Maas et al.

[11] Patent Number: 5,770,487
[45] Date of Patent: Jun. 23, 1998

[54] METHOD OF MANUFACTURING A DEVICE, BY WHICH METHOD A SUBSTRATE WITH SEMICONDUCTOR ELEMENT AND CONDUCTOR TRACKS IS GLUED TO A SUPPORT BODY WITH METALLIZATION

[75] Inventors: Henricus G. R. Maas; Ronald Dekker; Maria H. W. A. Van Deurzen, all of Eindhoven, Netherlands

[73] Assignee: U.S. Philips Corporation, New York, N.Y.

[21] Appl. No.: 641,058

[22] Filed: Apr. 29, 1996

[30] Foreign Application Priority Data

May 10, 1995 [EP] European Pat. Off. .............. 95201201

[51] Int. Cl.⁶ .................................................. H01L 21/84
[52] U.S. Cl. ...................... 438/164; 438/406; 438/459; 438/928; 438/977; 349/45
[58] Field of Search .............................. 438/30, 149, 164, 438/406, 458, 459, 928, 967, 977; 148/DIG. 135; 349/45, 149, 151, 152

[56] References Cited

U.S. PATENT DOCUMENTS

| | | | |
|---|---|---|---|
| 3,936,930 | 2/1976 | Stern | 349/152 |
| 5,317,433 | 5/1994 | Miyawaki et al. | 349/45 |
| 5,324,678 | 6/1994 | Kusunoki | 438/459 |
| 5,377,031 | 12/1994 | Vu et al. | 349/45 |
| 5,504,036 | 4/1996 | Dekker et al. | 438/459 |
| 5,537,234 | 7/1996 | Williams et al. | 349/149 |
| 5,569,621 | 10/1996 | Yallup et al. | 438/406 |
| 5,591,678 | 1/1997 | Bendik et al. | 438/459 |
| 5,627,106 | 5/1997 | Hsu | 438/459 |

FOREIGN PATENT DOCUMENTS

| | | |
|---|---|---|
| 0570224A2 | 11/1993 | European Pat. Off. . |
| 4-320216 | 11/1992 | Japan ................................ 349/149 |

Primary Examiner—Charles L. Bowers, Jr.
Assistant Examiner—Leon Radomsky
Attorney, Agent, or Firm—Steven R. Biren

[57] ABSTRACT

A method of manufacturing a device whereby a layer structure with semiconductor elements and conductor tracks is formed on a first side of a semiconductor wafer which is provided with a layer of semiconductor material disposed on an insulating layer. Then the semiconductor wafer is fastened with said first side to a support wafer by means of a glue layer, the support wafer being provided with a metallization. Material is then removed from the semiconductor wafer from the other, second side thereof until the insulating layer is exposed. Contact windows are provided in the insulating layer from the first side of the semiconductor wafer before the latter is refastened on the support wafer. These windows are filled with a material which can be removed selectively relative to the insulating layer. The contact windows are opened from the second side of the semiconductor wafer after the latter has been fastened on the support wafer and after the insulating layer has been exposed. Furthermore, openings are formed in the layer structure and in the flue layer at the areas of the contact windows, which openings extend down to the metallization on the support wafer, after which the contact windows and the openings formed are provided with conductive elements.

10 Claims, 5 Drawing Sheets

METHOD OF MANUFACTURING A DEVICE, BY WHICH METHOD A SUBSTRATE WITH SEMICONDUCTOR ELEMENT AND CONDUCTOR TRACKS IS GLUED TO A SUPPORT BODY WITH METALLIZATION

BACKGROUND OF THE INVENTION

The invention relates to a method of manufacturing a device, by which method a layer structure with semiconductor elements and conductor tracks is formed on a first side of a semiconductor wafer provided with a layer of semiconductor material disposed on an insulated layer, whereupon the semiconductor wafer is fastened with said first side to a support wafer by means of a glue layer, the support wafer being provided with a metallization, after which material is removed from the semiconductor wafer from the other, second side until the insulating layer has become exposed, and by which method the insulating layer is provided with contact windows, openings are formed in the layer structure and in the glue layer at the areas of the contact windows, which openings extend down to the metallization on the support wafer, and the contact windows and the openings formed are provided with conductive elements.

Devices may thus be formed which comprise a large number of semiconductor elements such as bipolar or MOS transistors which may be used as integrated circuits. The metallization on the support wafer may comprise, for example, a coil or a resistor, but it may alternatively be a conductive screening layer which may be grounded during operation of the device. It is also possible for devices to be formed in this way which form part of, for example, liquid crystal displays. The device formed may in that case form one of the plates between which the liquid crystal is enclosed, the semiconductor element a switching element with which a pixel of the display can be activated, and the metallization on the support wafer an electrode with which the liquid crystal can be locally aligned.

The semiconductor wafer is heated a few times to a temperature far in excess of 200° C. in practice in the manufacture of the semiconductor element. This happens, for example, during the formation of semiconductor zones, up to approximately 900° C., during the epitaxial growth of layers of semiconductor material, up to approximately 1,000° C., and during the deposition of layers of insulating material, up to approximately 400° to 700° C. After the semiconductor element has been formed, the wafer is not heated to temperatures above 200° C. anymore in practice in subsequent process steps. This is why the wafer with semiconductor element can be fastened on a glass support body, for example, with a synthetic resin glue such as an epoxy or acrylate glue. The glass is allowed to have a coefficient of expansion then which differs from that of the material of the semiconductor wafer.

EP-A-570 224 discloses a method of the kind mentioned in the opening paragraph whereby, after the semiconductor wafer has been glued on the support wafer and after the insulating layer has been exposed from the other, second side, the contact windows are provided in the insulating layer and the openings extending down to the metallization on the support wafer are provided in the layer structure and the glue layer. The metallization on the support wafer is a transparent electrode of a liquid crystal display which is used for aligning the liquid crystal locally.

In practice, process steps preceding gluing are carried out in a special clean room suitable for the manufacture of semiconductor elements, while gluing itself and the subsequent process steps are preferably carried out in a less clean space suitable for final mounting. After the glue connection has been made, the contact windows are provided in the exposed insulating layer in the known method described. In practice, the manufacture of such a comparatively complicated pattern of comparatively small contact windows requires a process with which photoresist patterns of comparatively small dimensions can be realized. This means that in both spaces mentioned very expensive photolithographic equipment must be present.

SUMMARY OF THE INVENTION

The invention has for its object inter alia to improve the method mentioned in the opening paragraph such that the products can be manufactured in two different spaces, expensive equipment being required in the clean room, but not in the other room suitable for final mounting.

According to the invention, the method is for this purpose characterized in that the contact windows are provided in the insulating layer from the first side of the semiconductor wafer before the latter is fastened to the support wafer, and are subsequently filled with a material which can be removed selectively relative to the insulating layer, whereupon the contact windows are opened from the second side of the semiconductor wafer after the latter has been fastened to the support wafer and after the insulating layer has been exposed.

The contact windows may be provided in the insulating layer by means of the same lithographic equipment which is used in the clean room for the manufacture of the semiconductor element and the conductor tracks on the first side of the semiconductor wafer. The material provided in the contact windows will be exposed during the treatment in which the insulating layer is exposed. This material can subsequently be selectively removed, so that the contact windows are opened from the second side. No photoresist mask need be provided for this on the exposed insulating layer.

The openings in the layer structure and in the glue layer may subsequently be formed simply with the use of the insulating layer provided with the contact windows as a mask. These openings, too, may accordingly be formed without expensive photolithographic equipment having to be arranged outside the clean room.

In a first preferred embodiment of the method, the contact windows are filled with a material which can be selectively removed relative to the insulating layer in that one of the layers belonging to the layer structure and made of a material which can be selectively removed relative to the material of the insulating layer is also deposited in the contact windows. The layer provided in the contact windows will be exposed during the treatment in which the insulating layer is exposed, and may subsequently be selectively removed from the contact windows. During the process of exposing the insulating layer, the glue layer is protected by the layer provided in the contact windows. This means that glue types can be used which are not resistant to the etchant used for exposing the insulating layer.

In the first preferred embodiment of the method, the layer structure is not allowed to comprise a layer made of the same material as that of the insulating layer because the insulating layer would be etched then during etching of the opening through this former layer. If the insulating layer is made of silicon oxide, the layer structure must not contain a silicon oxide layer. This limitation in the choice of material is avoided in a second preferred embodiment of the method whereby not only the contact windows in the insulating layer, but also the openings in the layer structure are provided from the first side of the semiconductor wafer before the latter is fastened to the support wafer, which openings are then filled up with material with which also the contact windows are filled.

During opening of the contact windows and forming of the openings in the layer structure, material is removed which can be removed selectively relative to the material of the insulating layer. Preferably, the contact windows and the openings in the layer structure are filled with the glue with which the semiconductor wafer is fastened to the support wafer.

Usual epoxy or acrylate glues are practically not attacked by a KOH solution with which material of the semiconductor slice, in practice silicon, can be selectively removed relative to the insulating layer, made of silicon oxide. This glue layer itself may be selectively removed relative to the insulating layer and the layers of the layer structure, for example, in an oxygen plasma. The openings in the glue layer may then be formed simultaneously with the openings in the layer structure. The insulating layer with the contact windows may serve as a mask during this.

BRIEF DESCRIPTION OF THE DRAWINGS

The invention will be explained in more detail below by way of example with reference to a drawing, in which.

DETAILED DESCRIPTION OF THE PREFERRED EMBODIMENTS

Figure 1:
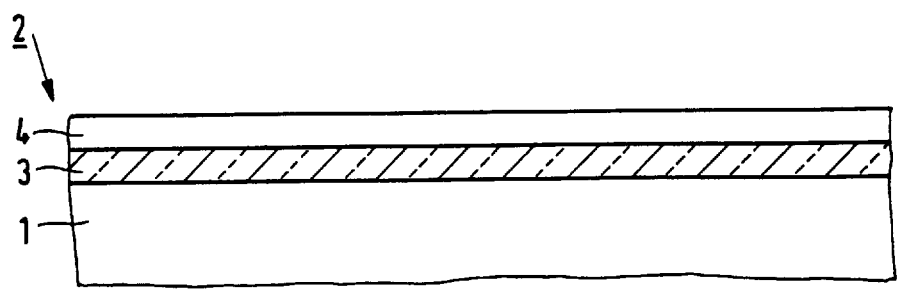
FIGS. 1 to 10 diagrammatically and in cross-section show a portion of a device in a number of stages of its manufacture by a first preferred embodiment of the method according to the invention, FIGS. 11 to 13 diagrammatically and in cross-section show a portion of a device in a few stages of its manufacture by a second preferred embodiment of the method according to the invention, and FIGS. 14 and 15 diagrammatically and in cross-section show a portion of two special devices in a stage of manufacture by the preferred embodiment of the method according to the invention.
Figure 2:
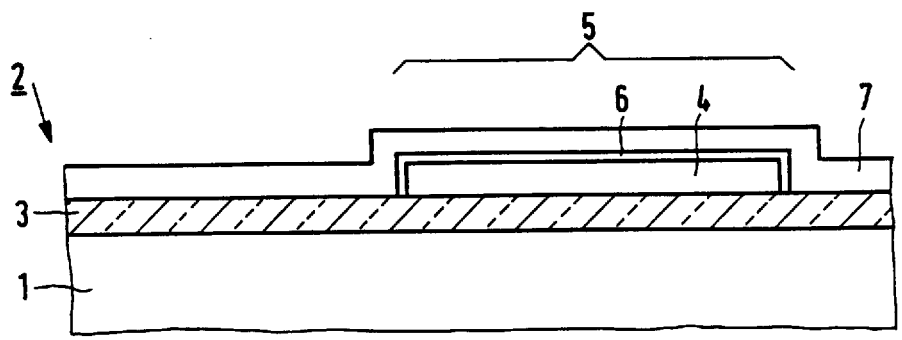
Figure 3:
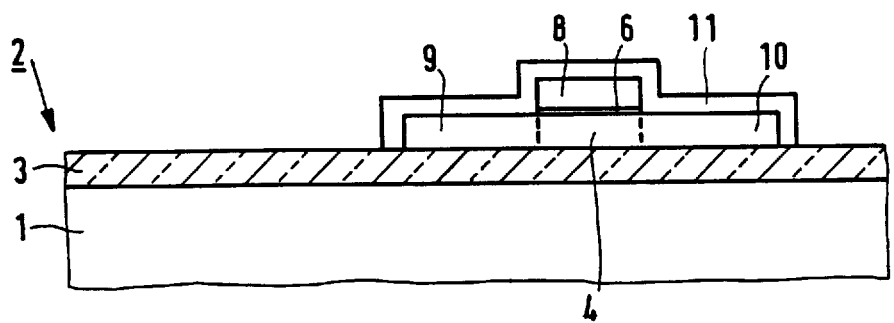
Figure 4:
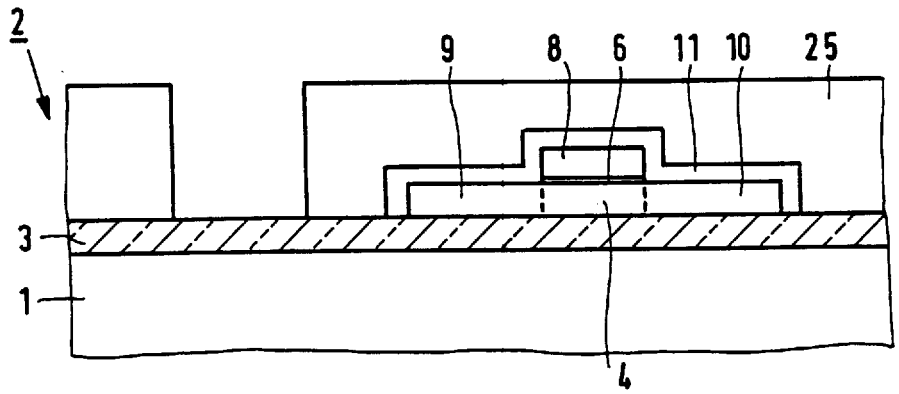
Figure 5:
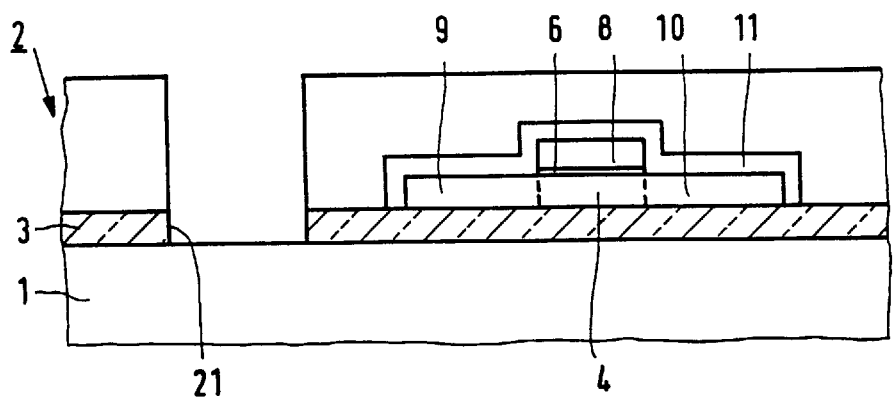
Figure 6:
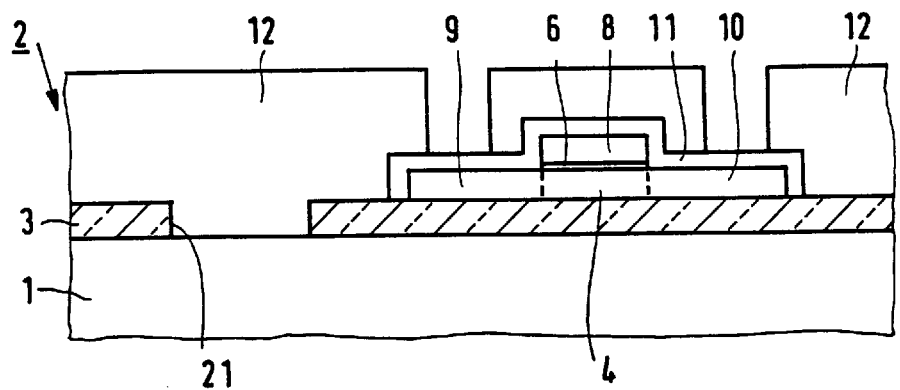

FIGS. 1 to 10 diagrammatically and in cross-section show a portion of a device in a number of stages of its manufacture by a first preferred embodiment of the method according to the invention. Manufacture starts with an approximately 700 $\mu$m thick semiconductor wafer 1 which is provided at its first side 2 with a layer of semiconductor material 4 disposed on an insulating layer 3. In the present example, this is a semiconductor wafer 1 of monocrystalline silicon in which an approximately 0.4 $\mu$m thick layer of silicon oxide 3 is present owing to implantation of oxygen ions. An approximately 0.1 $\mu$m thick layer of semiconductor material of monocrystalline silicon 4 is present on the silicon oxide layer 3. This, however, is immaterial to the essence of the invention. The semiconductor material layer may alternatively be a layer of polycrystalline or amorphous semiconductor material, which may be a semiconductor material other than silicon. The insulating layer may also be made of materials other than silicon oxide.

A layer structure with semiconductor elements and conductor tracks is on the first side 2 in usual manner. The semiconductor elements may be, for example, bipolar and MOS transistors. In the present example, the provision of a single element in the form of a MOS transistor is shown for simplicity's sake. The silicon layer 4 is for this purpose (FIG. 2) provided with a p-type doping in usual manner and subsequently subdivided into mutually insulated islands 5, in the present example in that the silicon layer 4 is etched away from the insulating layer 3 between the islands 5. A MOS transistor is formed in each of these islands. For this purpose, the silicon layer 4 is provided with a gate dielectric layer 6 by means of a usual thermal oxidation of the silicon layer 4. Then a layer of polycrystalline silicon 7 is deposited.

Subsequently (FIG. 3), a gate electrode 8 is formed in the layer of polycrystalline silicon 7. With the gate electrode 8 acting as a mask, a source 9 and drain 10 are subsequently formed through implantation of an n-type dopant. Finally, the transistor thus formed is covered with an insulating silicon oxide layer 11.

Figure 7:
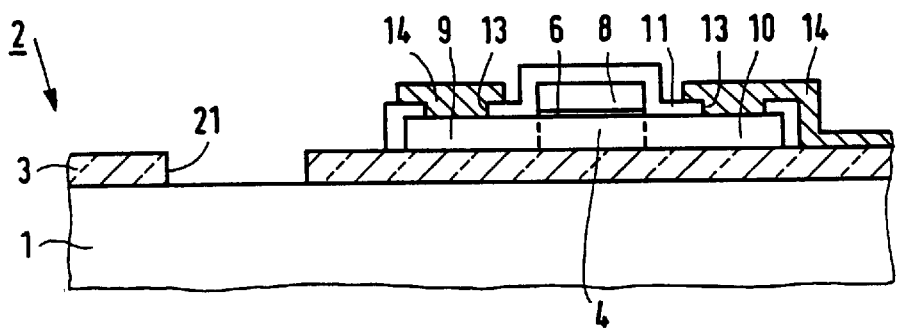
Figure 8:
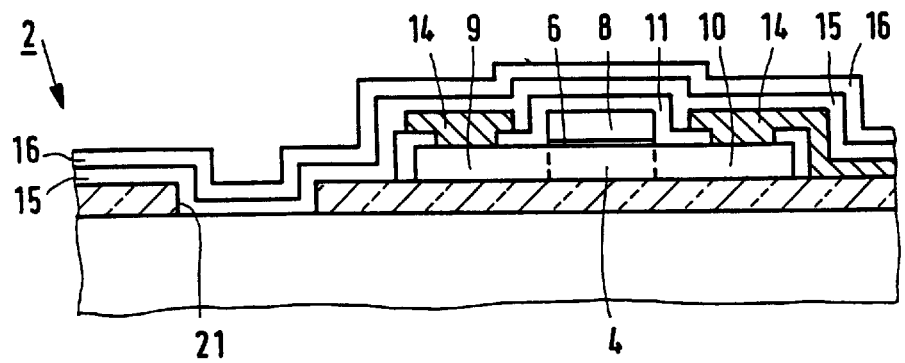
Figure 9:
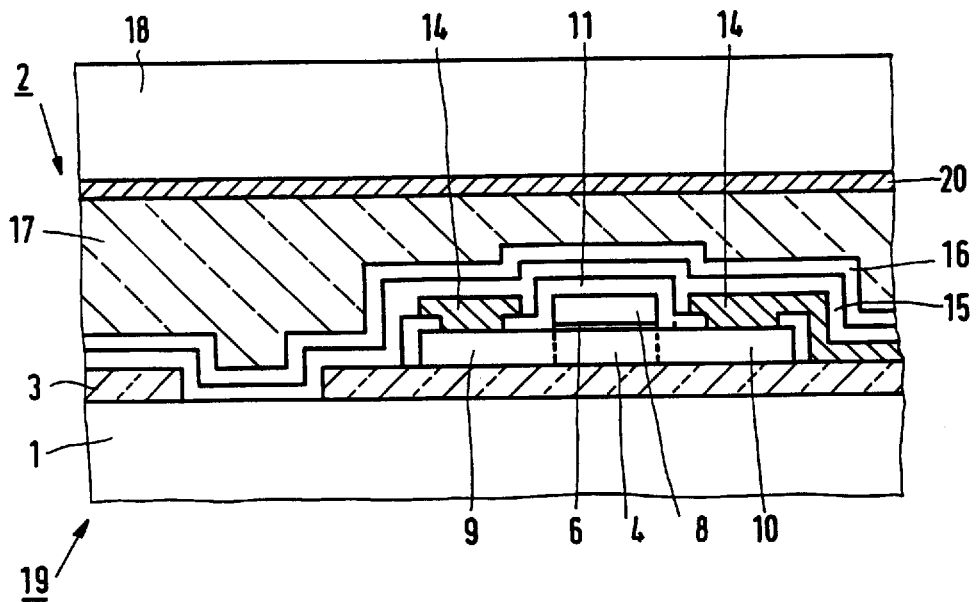

Then a usual photoresist mask 12 is provided (FIG. 6) by means of which contact windows 13 are etched into the silicon oxide layer 11 (FIG. 7). Then conductor tracks 14 are formed on the first side 2 of the semiconductor wafer 1 in usual manner.

Finally, the assembly thus created is passivated in usual manner with a silicon nitride layer 15 and a silicon oxynitride layer 16. The silicon nitride layer 15 is deposited by means of a usual plasma enhanced CVD (chemical vapour deposition) process, the silicon oxynitride layer 16 by means of a usual CVD process carried out at low temperature.

After that (FIG. 9), the semiconductor wafer 1 is fastened with its first side 2 to a support wafer 18 by means of a glue layer 17. In this example, the semiconductor wafer 1 is fastened to an approximately 1.5 mm thick support wafer 18 of glass by means of a layer of acrylate glue 17. The semiconductor wafer 1 need not be heated anymore to temperatures above approximately 200° C. after fastening to the support wafer 18, which is why no extreme requirements need be imposed on the fastening between the semiconductor wafer 1 and the support wafer 18 and on the support wafer 18 itself. The semiconductor wafer 1 may be fastened to the support wafer 18, for example, with a synthetic resin glue such as an epoxy glue, or an acrylate glue as in the example. The support wafer 18 is made of glass in the example. The support wafer may have a coefficient of expansion which differs from that of the material of the semiconductor wafer. Differences in expansion will be small during subsequent process steps and can then be accommodated by the glue layer.

After the semiconductor wafer 1 has been fastened to the support wafer 18, material is removed from the semiconductor wafer from the other, second side 19 (FIG. 10) until the insulating layer 3 has become exposed. To this end, the second side 19 is first subjected to a usual chemical-mechanical polishing treatment until the insulating layer of silicon oxide 3 has been approached to a few $\mu$m, after which this layer 3 is exposed in an etching bath with KOH. The etching treatment stops automatically when the layer 3 is reached, this layer acting as an etching stopper.

The support wafer 18 is provided with a metallization 20. This metallization 20 may comprise, for example, a coil or a resistor, but it may alternatively be a conductive screening layer, as in the present example, which can be grounded during operation of the device.

The insulating layer 3 is provided with contact windows 21, and openings 22 are formed in the layer structure 15, 16 and openings 23 in the glue layer 17 at the areas of the contact windows 21. Said openings 22, 23 extend down to the metallization 20 on the support wafer 18. The contact windows 21 and the openings 22, 23 formed are provided with conductive elements 24 by means of which the metallization 20 on the support wafer 18 can be contacted.

The contact windows 21 are provided in the insulating layer 3 from the first side of the semiconductor wafer 1 before the latter is fastened on the support wafer 18. Then (FIG. 4) a photoresist mask 25 is formed on the insulating layer on which the MOS transistor is formed, whereupon the contact windows 21 are etched into the insulating layer 3. These windows are subsequently filled with a material which can be removed selectively relative to the insulating layer 3. The contact windows 21 are opened (FIG. 10) from the second side 19 of the semiconductor wafer 1 after the latter has been fastened on the support wafer 18 and after the insulating layer 3 has become exposed. The material provided in the contact windows 21 is exposed during the same treatment in which the insulating layer 3 is exposed, and may subsequently be removed selectively, i.e. without the use of a mask.

The same lithographic equipment which is used in the clean room for the manufacture of the MOS transistor and the conductor tracks 14 on the first side 2 of the semiconductor wafer 1 can also be used for providing the contact windows 21 in the insulating layer 3, the photoresist mask 25 being used for this.

In the present example (FIG. 8), the contact windows 21 are filled with a material which can be removed selectively relative to the insulating layer 3 in that one of the layers belonging to the layer structure 15, 16, in this case the silicon nitride layer 15, is also deposited in the contact windows 21. The silicon nitride layer 15 provided in the contact windows 21 will be exposed in the same treatment in which the insulating layer 3 is exposed, and may subsequently be removed selectively from the contact windows 21 in usual manner. While the insulating layer is being exposed in the KOH solution, the glue layer 17 is protected by the layer 15 provided in the contact windows. This means that glue types may also be used which are not resistant to such a KOH solution.

The openings 22 in the layer structure 15, 16 and the openings 23 in the glue layer 17 are subsequently etched with the insulating layer 3 provided with the contact windows 21 acting as a mask. Said openings 22, 23 may thus be formed without the necessity of having expensive photolithographic equipment available outside the clean room.

In the embodiment described above, the opening 22 was provided through a layer structure comprising a silicon nitride layer 15 and a silicon oxynitride layer 16. These materials can be selectively etched relative to the silicon oxide of the insulating layer 3. The layer structure 15, 16 must not comprise a layer of the same material as that of the insulating layer 3 because in that case the insulating layer 3 would also be etched during etching of the opening 22 through the former layer. In the example described here, therefore, the layer structure 15, 16 must not comprise silicon oxide. This implies a limitation in the choice of materials to be used in the layer structure.

Figure 11:
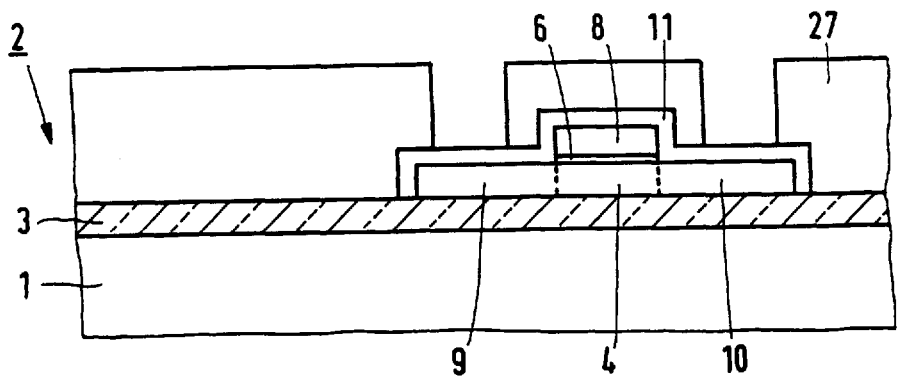
Figure 12:
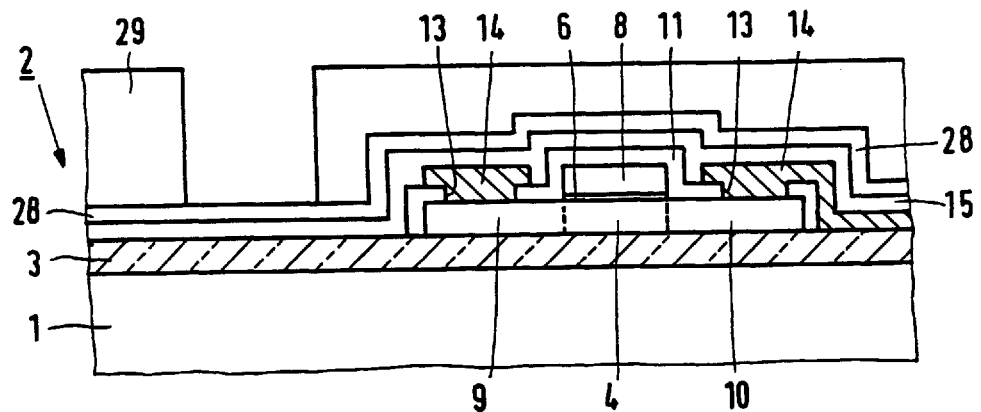
Figure 13:
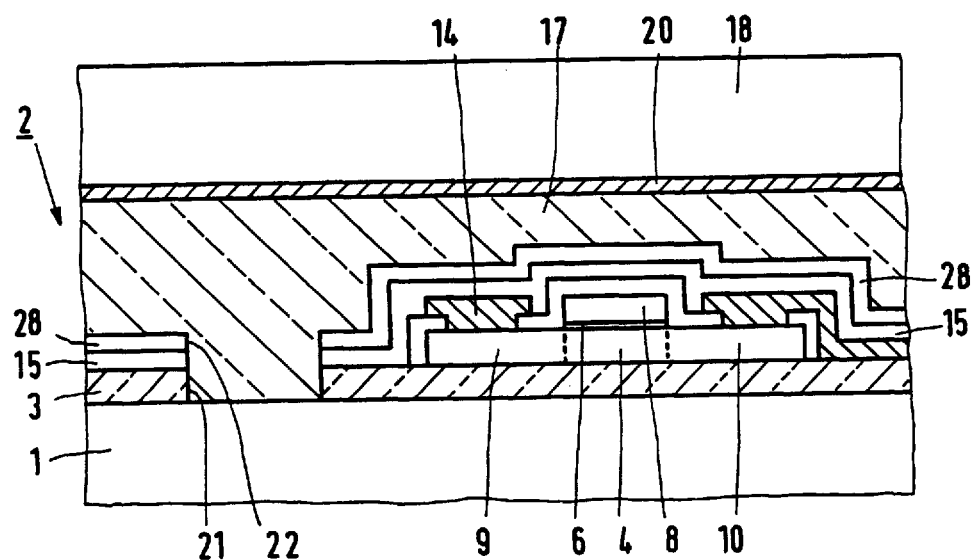

Said limitation in the choice of materials is avoided in the second preferred embodiment of the method depicted in FIGS. 11 to 13. Here not only the contact windows 21 are provided in the insulating layer 3, but also the openings 22 in the layer structure 15, 28 from the first side 2 of the semiconductor wafer 1 before the latter is fastened on the support wafer 18.

After the MOS transistor has been formed (FIG. 3), a photoresist mask 27 is provided by means of which the contact windows 13 are etched into the silicon oxide layer 11. Then, as described above, conductor tracks 14 are formed on the first side 2 of the semiconductor wafer 1 in usual manner, and the assembly thus formed is passivated with a silicon nitride layer 15 in usual manner and, in the present example, with a silicon oxide layer 28. The layer 28 in this embodiment is the same material as that of the insulating layer 3, but this will not give rise to problems in the subsequent process steps, as will become apparent.

After a further photoresist mask 29 has been provided (FIG. 12), the openings 22 are etched into the layer structure 15, 28 and the contact windows 21 into the insulating layer 3.

Figure 10:
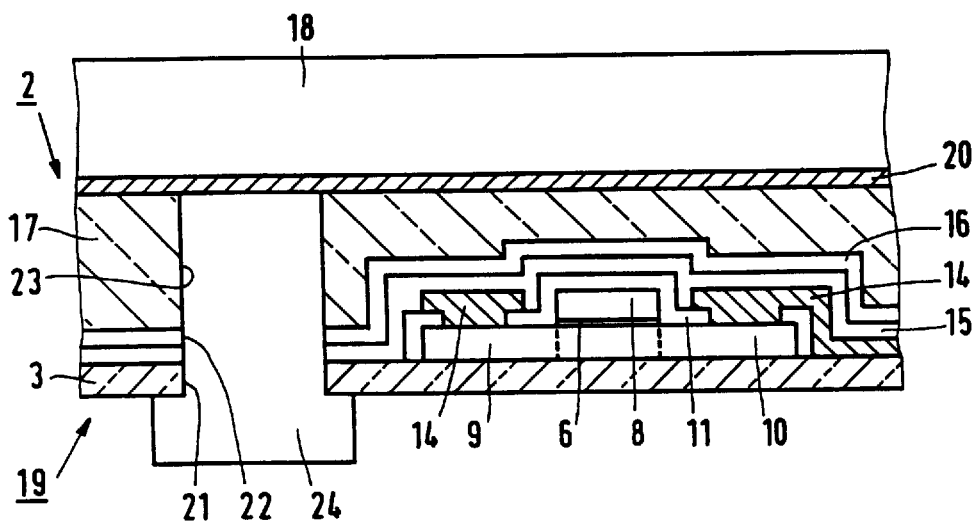

In this embodiment, again, the contact windows 21 are filled with a material which can be removed selectively relative to the material of the insulating layer 3. Here not only the contact windows 21 are filled, but also the openings 22 in the layer structure 15, 28 are filled with the same material with which the contact windows 21 are filled (FIG. 13). Then the contact windows 21 are opened from the second side 19 of the semiconductor wafer 1 after the latter has been fastened on the support wafer 18 and after the insulating layer 3 has been exposed, whereupon the openings 22 are etched into the layer structure 15, 28. A device is then obtained as shown in FIG. 10.

During opening of the contact windows 21 and etching of the openings 22 in the layer structure 15, 28, material is removed which can be removed selectively relative to the material of the insulating layer 3. Preferably, as in the present example and as shown in FIG. 13, the contact windows 21 and the openings 22 in the layer structure 15, 28 are filled with the glue layer 17 with which the semiconductor wafer 1 is fastened on the support wafer 17.

In practice, usual epoxy or acrylate glues are substantially not attacked by a KOH solution with which silicon can be removed from the semiconductor wafer 1 selectively relative to the insulating layer 3 of silicon oxide. This glue layer 17 itself can be selectively removed relative to the insulating layer, in this example silicon oxide, and the other layers 15, 28 in the layer structure, for example in an oxygen plasma. The openings 23 in the glue layer 17 may then be formed simultaneously with the openings 22 in the layer structure 15, 28. The insulating layer 3 with the contact windows 21 serves as a mask during this.

Finally, the contact windows 21 and the openings 22, 23 formed are provided with conductive elements 24, preferably electrochemically, whereby the metallization 20 on the support wafer 18 can be contacted. Material may be selectively grown in the contact windows 21 and the openings 22, 23 in this way. Again, therefore, no expensive photolithographic equipment is necessary for providing the conductive elements.

Figure 14:
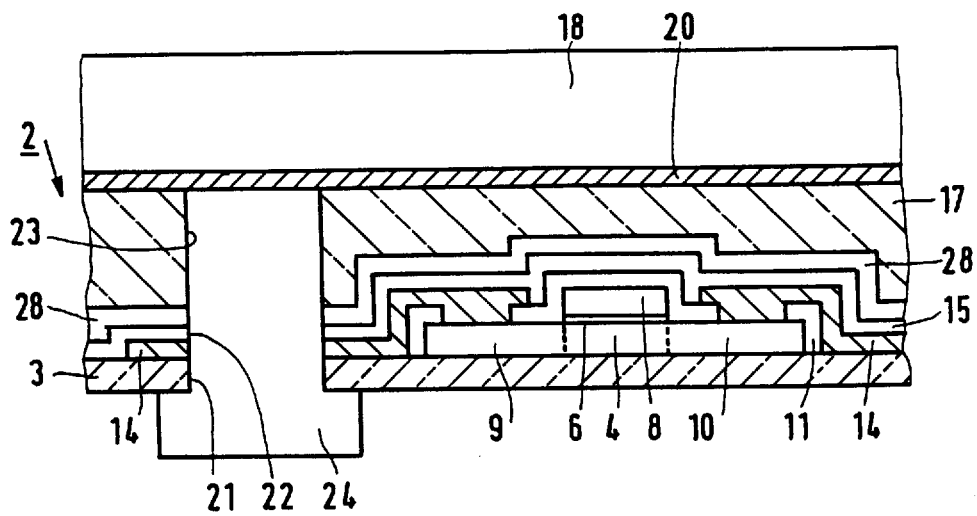

FIG. 14 shows a device manufactured as described above, wherein openings 22 are provided in a layer structure 14, 15, 28 of which the conductor track 14 connected to the source 9 of the MOS transistor forms part. The conductive element 24 thus connects the source 9 to the metallization 20 on the support wafer in the openings 22 and 23. No expensive equipment is necessary for providing such a connection. The layer in which the conductor tracks 14 are formed may fill the contact windows in the same manner as in the embodiment described with reference to FIGS. 1 to 10, where it relates to the silicon nitride layer 15.

Figure 15:
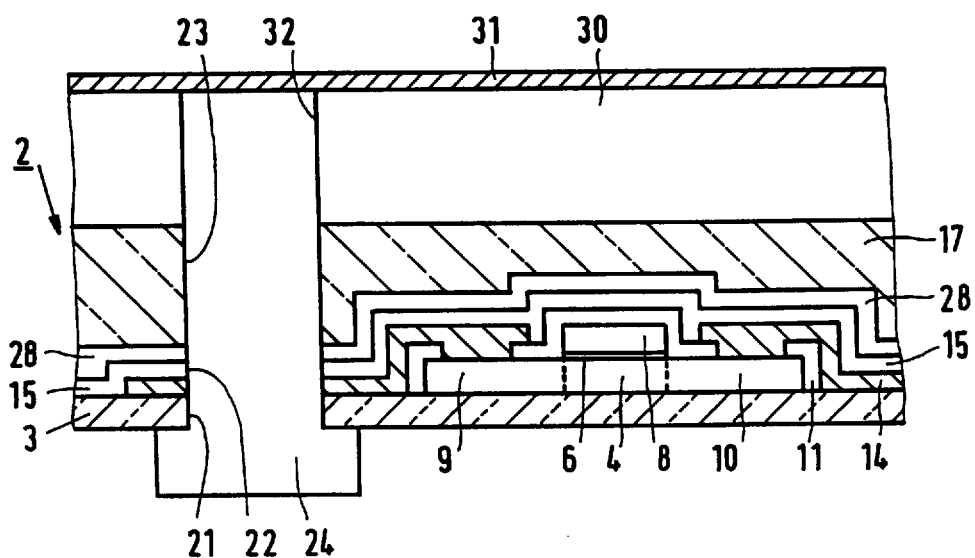

FIG. 15, finally, shows a device manufactured as described above, where the semiconductor wafer 1 is fastened with the glue layer 17 to a support wafer 30 with a metallization 31 provided on the side of the support wafer 30 facing away from the semiconductor wafer 1. The support wafer is also provided with an opening 32, so that the conductive element 24 makes contact with the metallization 31. While the opening 32 is being formed in the support wafer, the insulating layer 3 with the contact windows 21 can be used as a mask. The support wafer 30 must then be of a material which can be etched selectively relative to the silicon oxide of the insulating layer 3. The support wafer 30 is made, for example, of aluminium oxide. If the openings 32 are provided in the support wafer 30 before the semiconductor wafer 1 is fastened thereon, the support wafer can be made of glass. A condition is then that the contact windows 21 and the openings 32 are mutually aligned in fastening of the semiconductor wafer 1 on the support wafer 30. No expensive equipment is required for making the opening 32 in the support wafer 30.

With the procedures as described above, it is possible to form not only devices comprising a large number of semiconductor elements, such as bipolar or MOS transistors, which may be used as integrated circuits, but also devices forming part, for example, of liquid crystal displays. The device formed may then be one of the plates between which the liquid crystal is enclosed. This liquid crystal is then present, for example, at the side of the support wafer facing away from the semiconductor wafer. The semiconductor element may be a switching element with which a pixel of the display can be activated, while the metallization on the support wafer is an electrode with which the liquid crystal can be locally aligned.

We claim:

1. A method of manufacturing a device, the method comprising the steps of: providing a layer structure with semiconductor elements and conductor tracks formed on a first side of a semiconductor wafer provided with a layer of semiconductor material disposed on an insulating layer, fastening the semiconductor wafer with said first side to a support wafer by means of a glue layer, the support wafer being provided with metallization, removing material from the semiconductor wafer from the other, second side until the insulating layer has become exposed, providing the insulating layer with contact windows, forming openings in the layer structure and in the glue layer at the areas of the contact windows, which openings extend down to the metallization on the support wafer, and providing the contact windows and the openings with conductive elements, the contact windows being provided in the insulating layer from the first side of the semiconductor wafer before the latter is fastened to the support wafer, and being subsequently filled with a material which can be removed selectively relative to the insulating layer, whereupon the contact windows are opened from the second side of the semiconductor wafer after the latter has been fastened to the support wafer and after the insulating layer has been exposed.

2. A method as claimed in claim 1, characterized in that the openings are etched into the layer structure and into the glue layer from the second side of the semiconductor wafer, the insulating layer with the contact windows acting as a mask, after the semiconductor wafer has been fastened on the support wafer, the insulating layer has been exposed, and the contact windows have been opened.

3. A method as claimed in claim 2, characterized in that one of the layers belonging to the layer structure is also deposited in the contact windows.

4. A method as claimed in claim 2, characterized in that the openings in the layer structure are also provided from the first side of the semiconductor wafer before the latter is fastened on the support wafer, and are subsequently filled with material with which also the contact windows are filled.

5. A method as claimed in claim 4, characterized in that the openings in the layer structure and the contact windows are filled with the glue with which the semiconductor wafer is fastened on the support wafer.

6. A method as claimed in claim 1, characterized in that the contact windows and the openings in the layer structure are electrochemically provided with the conductive elements.

7. A method as claimed in claim 1, characterized in that the opening in the layer structure is provided in a layer structure which comprises a conductor track on the first side of the wafer.

8. A method as claimed in claim 1, characterized in that the metallization is provided on the support wafer at the side thereof which faces away from the semiconductor wafer.

9. A method as claimed in claim 1, characterized in that one of the layers belonging to the layer structure is also deposited in the contact windows.

10. A method as claimed in claim 1, characterized in that the openings in the layer structure are also provided from the first side of the semiconductor wafer before the latter is fastened on the support wafer, and are subsequently filled with material with which also the contact windows are filled.

* * * * *